United States Patent
Yang et al.

(10) Patent No.: US 7,863,078 B2
(45) Date of Patent: *Jan. 4, 2011

(54) METHOD FOR MAKING AN ANTI-REFLECTION FILM OF A SOLAR CELL

(75) Inventors: Tsun-Neng Yang, Taipei (TW); Shan-Ming Lan, Taoyuan County (TW); Chin-Chen Chiang, Taoyuan County (TW); Wei-Yang Ma, Taipei County (TW); Chien-Te Ku, Taoyuan County (TW); Yu-Hsiang Huang, Taoyuan County (TW)

(73) Assignee: Atomic Energy Council-Institute of Nuclear Energy Research, Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/007,156

(22) Filed: Jan. 7, 2008

(65) Prior Publication Data
US 2010/0279453 A1 Nov. 4, 2010

(51) Int. Cl.
*H01L 31/18* (2006.01)
(52) U.S. Cl. ................ 438/72; 257/E31.119

(58) Field of Classification Search ................ 438/72; 257/E27.124, E27.125, E25.007, E31.119
See application file for complete search history.

(56) References Cited

U.S. PATENT DOCUMENTS

| | | | |
|---|---|---|---|
| 6,350,945 B1 * | 2/2002 | Mizuno ................ 136/246 |
| 6,384,317 B1 * | 5/2002 | Kerschaver et al. ......... 136/256 |
| 6,479,316 B1 * | 11/2002 | Hanoka et al. ............ 438/72 |
| 2010/0216274 A1 * | 8/2010 | Yang et al. .............. 438/58 |

* cited by examiner

*Primary Examiner*—Thao P. Le
(74) *Attorney, Agent, or Firm*—Jackson IPG PLLC; Demian K. Jackson (57) ABSTRACT

A method is disclosed for making an anti-reflection film of a solar cell. The method includes the step of providing a laminate. The laminate includes a ceramic substrate, a titanium-based compound film, a $p^+$ type poly-silicon back surface field, a $p^-$ type poly-silicon light-soaking film and an $n^+$ type poly-silicon emitter. The laminate is passivated with SiCNO:Ar plasma in a plasma-enhanced vapor deposition device, thus filling the dangling bonds of the silicon atoms at the surface of the $n^+$ type poly-silicon emitter, the dangling bonds of the silicon grains at the grain boundaries of the $p^-$ type poly-silicon light-soaking film and the dangling bonds of the silicon atoms in the $p^+$ type poly-silicon back surface field. Finally, the $n^+$ type poly-silicon emitter is coated with an anti-reflection film of $SiCN/SiO_2$.

12 Claims, 9 Drawing Sheets

METHOD FOR MAKING AN ANTI-REFLECTION FILM OF A SOLAR CELL

BACKGROUND OF INVENTION

1. Field of Invention

The present invention relates to a method for making an anti-reflection film of a solar cell and, more particularly, to a method for using SiCNO:Ar plasma to passivate a poly-silicon laminate to fill dangling bonds of silicon on the surface and at internal grain boundaries, thus providing an anti-reflection film of $SiCN/SiO_2$ for a solar cell.

2. Related Prior Art

Most silicon-based solar cells are made in low-temperature processes based on plasma-enhanced chemical vapor deposition ("PECVD"). An amorphous-silicon or microcrystalline-silicon film is coated on a glass, aluminum, silicon, stainless steel or plastic substrate. A back contact is made of aluminum, gold, silver or transparent conductive oxide such as indium-tin oxide ("ITO") and zinc oxide.

The primary advantage of the low-temperature processes is the wide variety of materials that can be used to make the substrates. However, they suffer drawbacks such as defective silicon films, low photoelectrical conversion efficiencies and low light-soaking stability.

In the PECVD, while coating the microcrystalline silicon film, a silicon material is highly diluted in hydrogen. For example, $[H_2]/[SiH_4]>15$. That is, the concentration or flow rate of $H_2$ is more than 15 times as high as that of $SiH_4$. The problems with the PECVD include a low growth rate of the film, a long process and a high cost.

As discussed above, there are problems with the PECVD-based low-temperature processes for making poly-silicon thin-film solar cells. Firstly, there are many defects in the silicon films. Secondly, the photoelectrical conversion efficiencies are low. Thirdly, the light soaking stabilities are low. Fourthly, the growth rates of the films are low. Fifthly, the processes are long. Sixthly, the costs are high.

To make the poly-silicon solar cells, there are other techniques such as solid phase crystallization ("SPC") and aluminum-induced crystallization ("AIC"). The SPC is based on the PECVD. An amorphous silicon film is deposited, intensively heated and annealed at a high temperature. Thus, a poly-silicon film with a grain size of 1 to 2 micrometers is made.

In the AIC as shown in FIGS. 5 to 9, an aluminum film 42 is coated on a substrate 41. An amorphous silicon film 43 is coated on the aluminum film 42 based on the PECVD and annealed at a temperature of about 575 degrees Celsius for a long time to form a seed layer 44. Then, it is subjected to an epitaxial process such as the PECVD or an electron cyclotron resonance chemical deposition ("ECR-CVD") to make a poly-silicon film 45. The resultant grain size is about 0.1 to 10 micrometers. The AIC however involves many steps and takes a long time. The cost is therefore high.

The present invention is therefore intended to obviate or at least alleviate the problems encountered in prior art.

SUMMARY OF INVENTION

The primary objective of the present invention to provide a method for making an anti-reflection film of a solar cell.

To achieve the primary objective of the present invention, the method includes the step of providing a laminate. The laminate includes a ceramic substrate, a titanium-based compound film, a $p^+$ type poly-silicon back surface field, a $p^-$ type poly-silicon light-soaking film and an $n^+$ type poly-silicon emitter. The laminate is passivated with SiCNO:Ar plasma in a plasma-enhanced vapor deposition device, thus filling the dangling bonds of the silicon atoms at the surface of the $n^+$ type poly-silicon emitter, the dangling bonds of the silicon grains at the grain boundaries of the $p^-$ type poly-silicon light-soaking film and the dangling bonds of the silicon atoms in the $p^+$ type poly-silicon back surface field. Finally, the $n^+$ type poly-silicon emitter is coated with an anti-reflection film of $SiCN/SiO_2$.

Other objectives, advantages and features of the present invention will become apparent from the following description referring to the attached drawings.

BRIEF DESCRIPTION OF DRAWINGS

The present invention will be described via the detailed illustration of embodiments in view of prior art referring to the drawings.

DETAILED DESCRIPTION OF PREFERRED EMBODIMENT

Referring to FIGS. 1 through 4, there is shown a method for making an anti-reflection film of a solar cell according to a first embodiment of the present invention.

Figure 1:
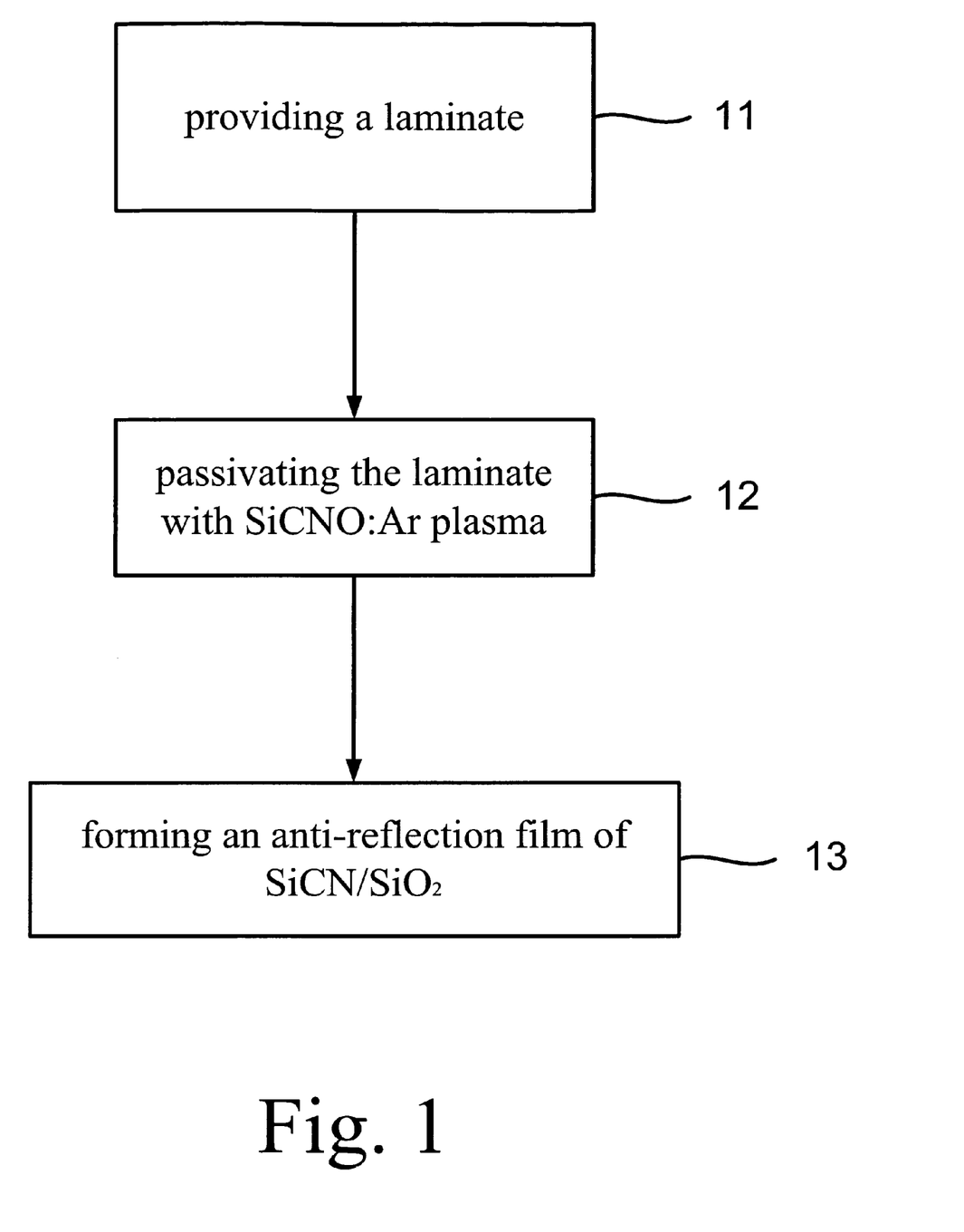
FIG. 1 is a flowchart of a method for making an anti-reflection film of a solar cell according to a first embodiment of the present invention.
Figure 2:
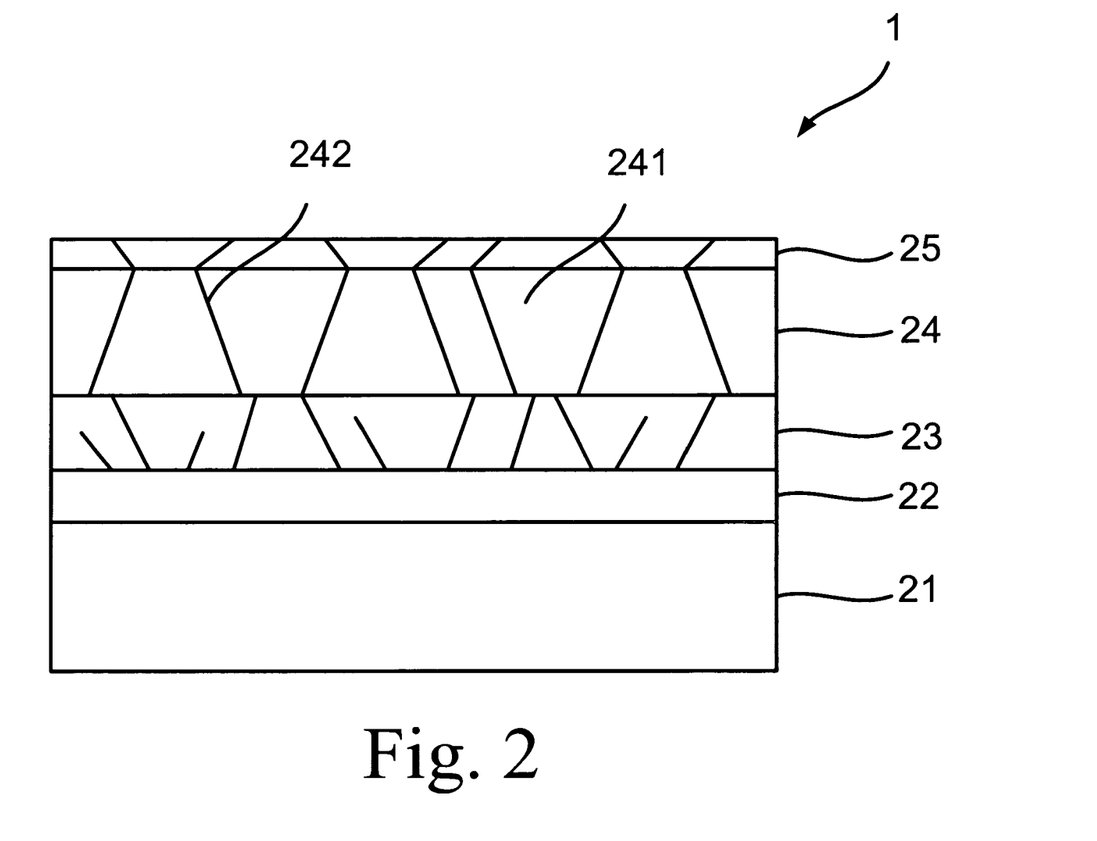
FIG. 2 is a side view of a laminate for a thin-film solar cell to be processed in the method shown in FIG. 1.

Referring to FIGS. 1 and 2, at 11, a laminate 1 is made for a solar cell. At first, a ceramic substrate 21 is provided. The ceramic substrate 21 is made of aluminum oxide ("$Al_2O_3$"). The thickness of the ceramic substrate 21 is 0.1 to 1.0 mm.

Then, the ceramic substrate 21 is coated with a titanium-based compound film 22. The thickness of the titanium-based compound film 22 is 500 to 5000 angstroms. The titanium-based compound film 22 is used as a back contact and a seed layer. The titanium-based compound film 22 may be made of $TiSi_2$, TiN, TiC, $TiB_2$ or $TiC_xN_y$.

Then, in a high-temperature atmospheric pressure chemical vapor deposition ("APCVD") system, the titanium-based compound film 22 is dosed with boron. Thus, the titanium-based compound film 22 is coated with a $p^+$ type poly-silicon back surface field 23. The thickness of the $p^+$ type poly-silicon back surface field 23 is 1 micrometer. In addition, the $p^+$ type poly-silicon back surface field 23 is coated with a $p^-$ type poly-silicon light-soaking film 24. The thickness of the $p^-$ type poly-silicon light-soaking film 24 is 1 to 15 micrometers.

Then, the p⁻ type poly-silicon light-soaking film 24 is dosed with phosphor so that the p⁻ type poly-silicon light-soaking film 24 is coated with an n⁺ type poly-silicon emitter 25 and that the laminate 1 is made. The size of the silicon grains 241 at the grain boundaries 242 of the p⁻ type poly-silicon light-soaking film 24 is larger than 10 micrometers. The thickness of the n⁺ type poly-silicon emitter 25 is 1000 angstroms.

Figure 3:
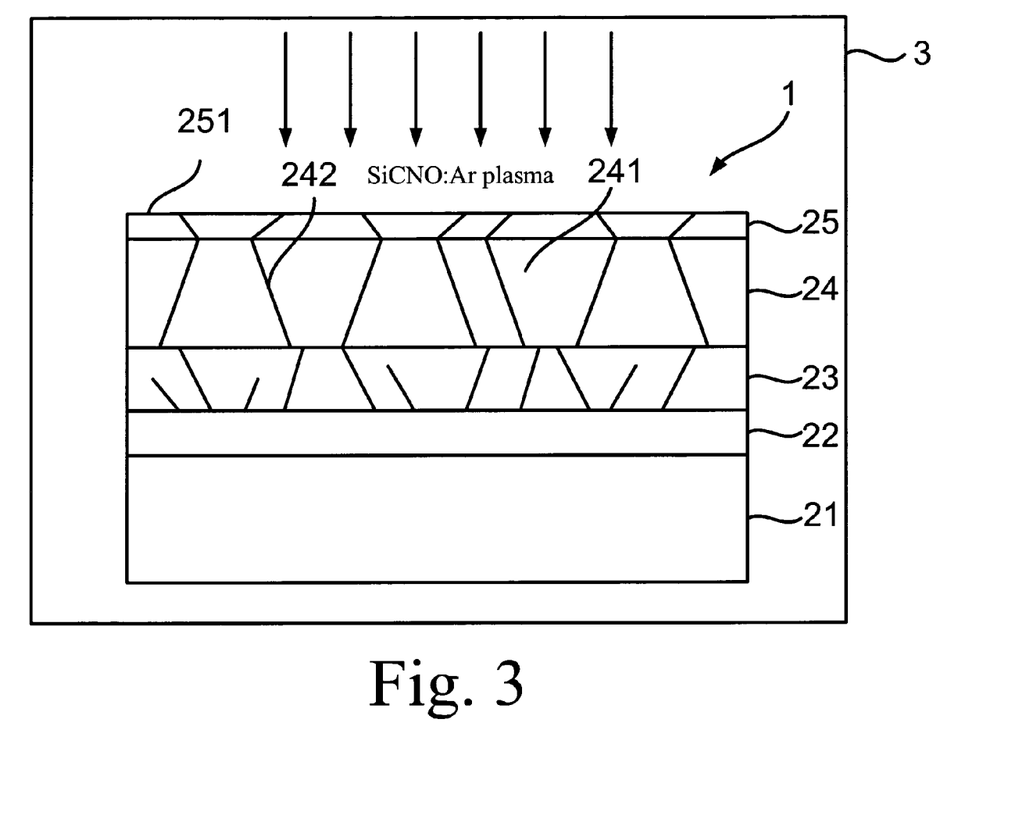
FIG. 3 is a side view of the laminate being processed in the method shown in FIG. 1.

Referring to FIGS. 1 and 3, at 12, the laminate 1 is passivated with SiCNO:Ar plasma. To this end, a plasma-enhanced chemical vapor deposition ("PECVD") device 3 is operated at 13.56 MHz. In the PECVD device 3, silane, nitrous oxide and methane are used as gradients of the SiCNO:Ar plasma, and argon is used as a carrier. The laminate 1 is passivated with the SiCNO:Ar plasma at the room temperature to 400 degrees Celsius, for 1 to 30 minutes. Thus, the dangling bonds of the silicon atoms at the surface 251 of the n⁺ type poly-silicon emitter 25 are filled, and so are the dangling bonds of the silicon grains 241 at the grain boundaries 242 of the p⁻ type poly-silicon light-soaking film 24. The dangling bonds of the silicon atoms in the p⁺ type poly-silicon back surface field 23 are also filled.

Figure 4:
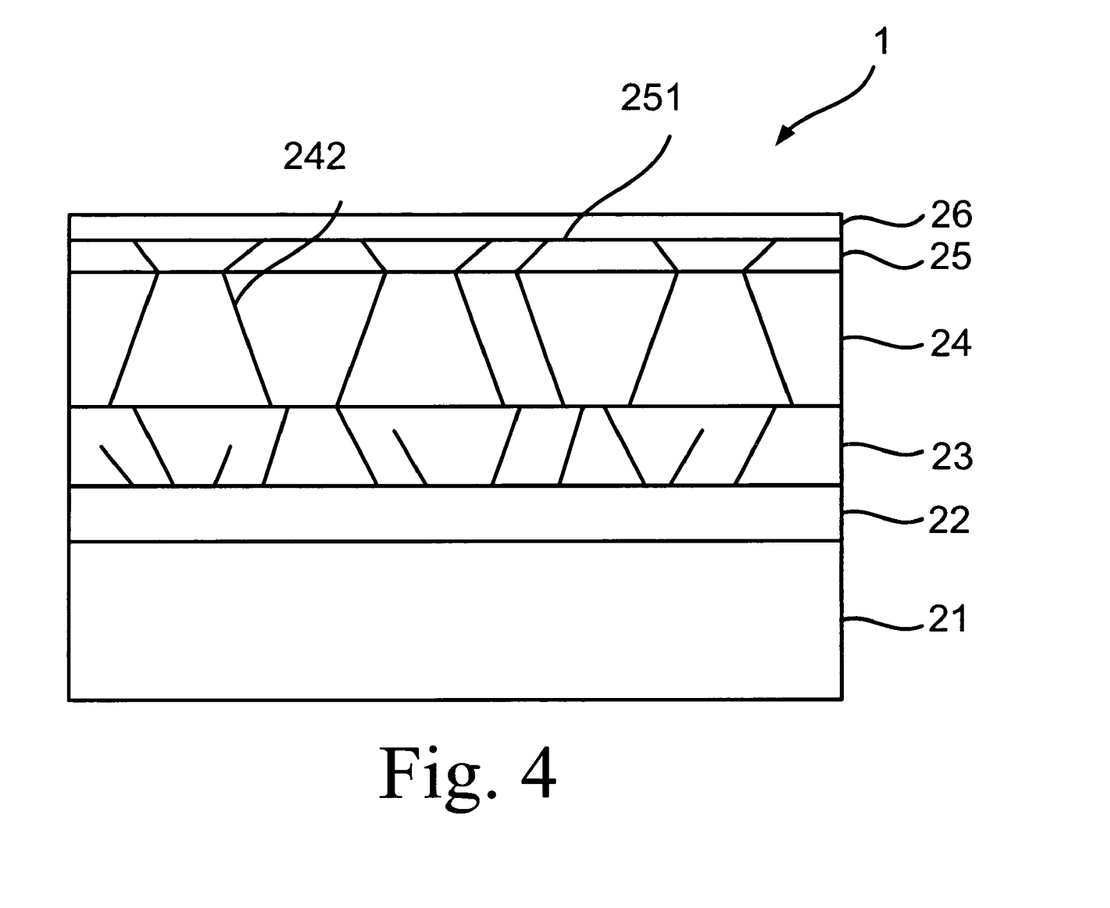
FIG. 4 is a side view of the laminate after being processed in the method shown in FIG. 1.
Figure 5:
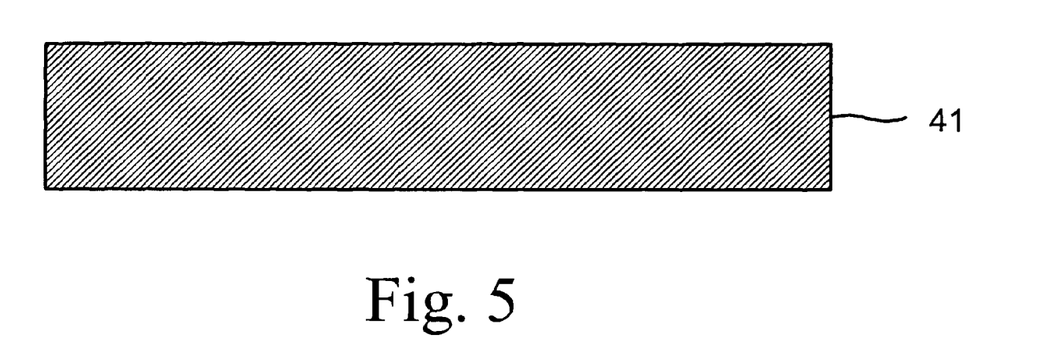
FIG. 5 is a side view of a substrate used in a conventional method for making a poly-silicon film on a substrate in a low-temperature process.
Figure 6:
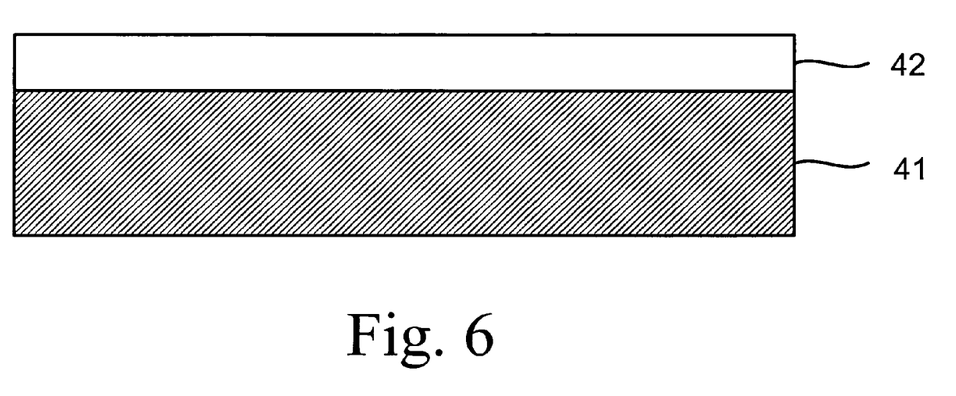
FIG. 6 is a side view of an aluminum film coated on the substrate shown in FIG. 5.
Figure 7:
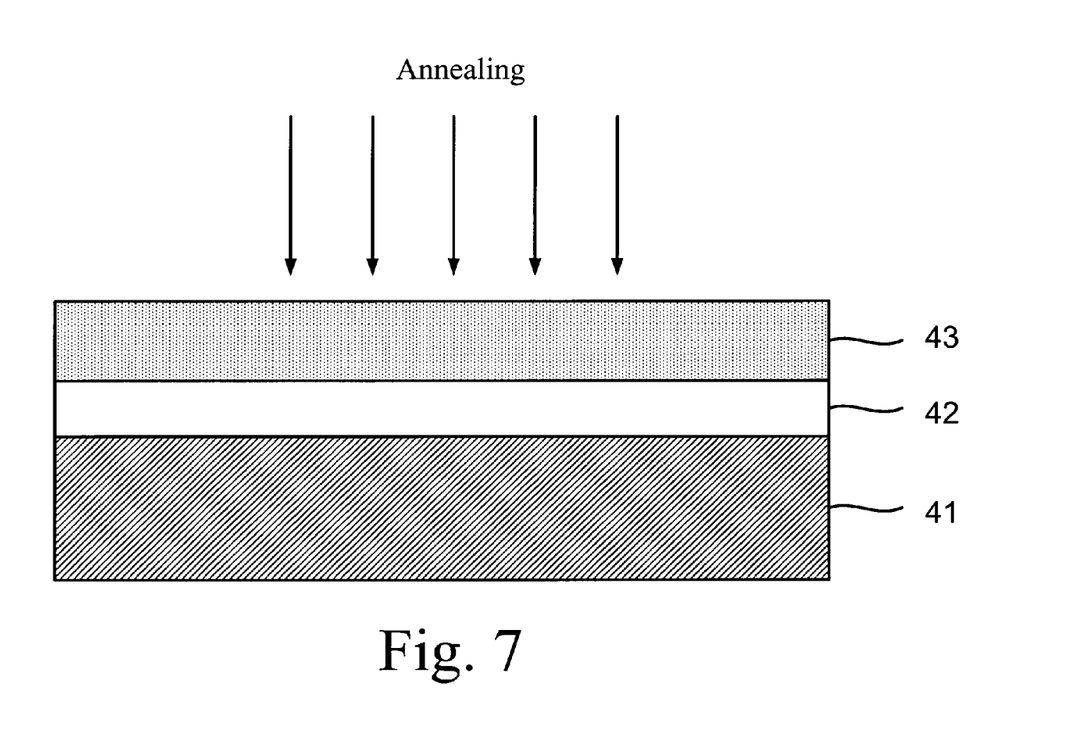
FIG. 7 is a side view of an amorphous silicon film coated on the aluminum film shown in FIG. 6.
Figure 8:
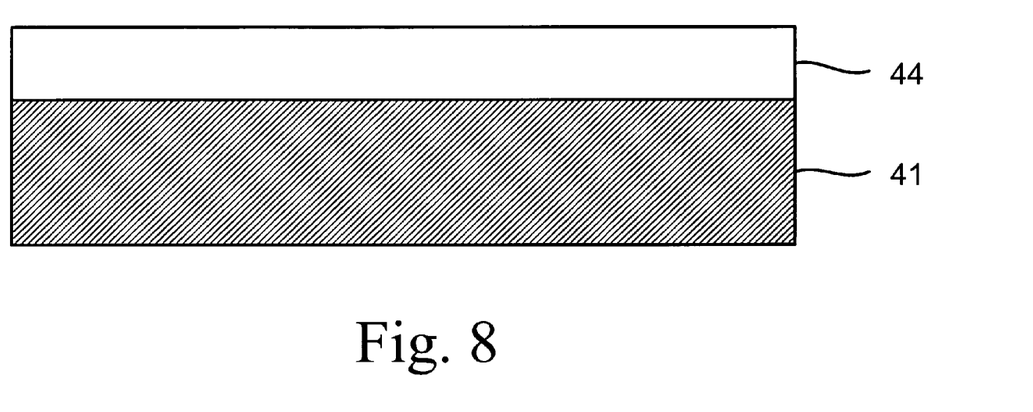
FIG. 8 is a side view of a seed layer made of the amorphous silicon film and the aluminum film shown in FIG. 7.
Figure 9:
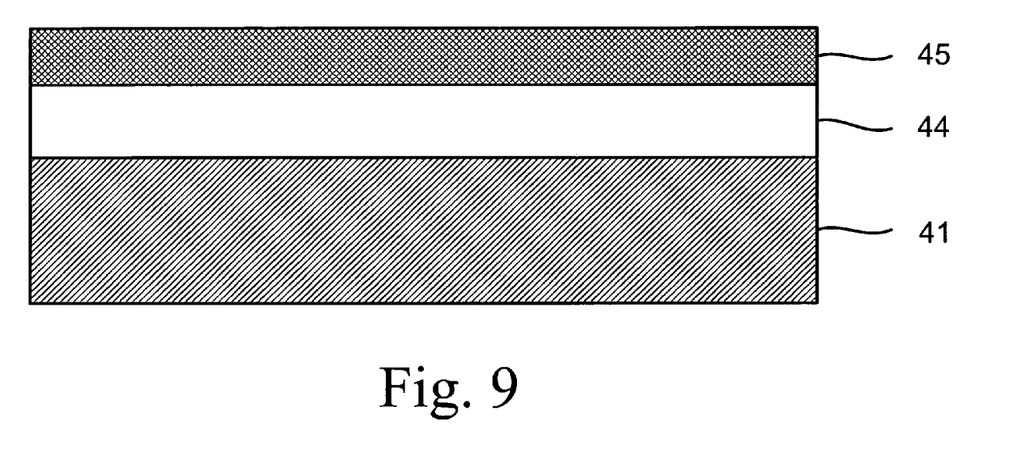
FIG. 9 is a side view of a poly-silicon film coated on the seed layer shown in FIG. 8.

Referring to FIGS. 1 and 4, at 13, the n⁺ type poly-silicon emitter 25 is coated with a SiCN/SiO$_2$ film 26. The SiCN/SiO$_2$ film 26 is anti-reflection and therefore used as an anti-reflection film.

As discussed above, the ceramic substrate 21 made of aluminum oxide is coated with the titanium-based compound film 22 used as the back contact and the seed layer for the poly-silicon films. The titanium-based compound film 22 is dosed with boron so that the titanium-based compound film 22 is coated with the p⁺ type poly-silicon back surface field 23 and that the p⁺ type poly-silicon back surface field 23 is coated with the p⁻ type poly-silicon light-soaking film 24. The p⁻ type poly-silicon light-soaking film 24 is dosed with phosphor so that the p⁻ type poly-silicon light-soaking film 24 is coated with the n⁺ type poly-silicon emitter 25. The laminate 1 is passivated with SiCNO:Ar plasma so that the n⁺ type poly-silicon emitter 25 is coated with the anti-reflection film of SiCN/SiO$_2$. Without the passivation, the poly-silicon materials would exhibit high mobility and large diffusion length and require much time for recombination. With the passivation, the poly-silicon materials exhibit high photoelectrical conversion efficiencies and stable light-soaking capabilities. Hence, the epitaxial growth rate of the silicon is high, and so is the quality. The process is simple, and the cost in the equipment is low.

The present invention has been described via the detailed illustration of the preferred embodiment. Those skilled in the art can derive variations from the preferred embodiment without departing from the scope of the present invention. Therefore, the preferred embodiment shall not limit the scope of the present invention defined in the claims.

The invention claimed is:

1. A method for making an anti-reflection film of a solar cell comprising the steps of:
   providing a laminate comprising:
   a ceramic substrate;
   a titanium-based compound film coated on the ceramic substrate;
   a p⁺ type poly-silicon back surface field coated on the titanium-based compound film in a high-temperature atmospheric pressure chemical vapor deposition system;
   a p⁻ type poly-silicon light-soaking film coated on the p⁺ type poly-silicon back surface field in the high-temperature atmospheric pressure chemical vapor deposition system; and
   an n⁺ type poly-silicon emitter coated on the p⁻ type poly-silicon light-soaking film;
   passivating the laminate with SiCNO:Ar plasma in a plasma-enhanced vapor deposition device, thus filling the dangling bonds of the silicon atoms at the surface of the n⁺ type poly-silicon emitter, the dangling bonds of the silicon grains at the grain boundaries of the p⁻ type poly-silicon light-soaking film and the dangling bonds of the silicon atoms in the p⁺ type poly-silicon back surface field; and
   coating the n⁺ type poly-silicon emitter with an anti-reflection film of SiCN/SiO$_2$.

2. The method according to claim 1, wherein the titanium-based compound film is used as a seed layer for poly-silicon films.

3. The method according to claim 1, wherein the titanium-based compound film is made of a material selected from a group consisting of TiSi$_2$, TiN, TiC, TiB$_2$ and TiC$_x$N$_y$.

4. The method according to claim 1, wherein the thickness of the ceramic substrate is 0.1 to 1.0 mm.

5. The method according to claim 1, wherein the thickness of the titanium-based compound film is 500 to 5000 angstroms.

6. The method according to claim 1, wherein the thickness of the p⁺ type poly-silicon back surface field is not larger than 1 micrometer.

7. The method according to claim 1, wherein the thickness of the p⁻ type poly-silicon light-soaking film is 1 to 15 micrometers.

8. The method according to claim 7, wherein the size of the grains of the p⁻ type poly-silicon light-soaking film is larger than 10 micrometers.

9. The method according to claim 1, wherein the thickness of the n⁺ type poly-silicon emitter is 1000 angstroms.

10. The method according to claim 1, wherein the step of passivating is executed at the room temperature to 400 degrees Celsius.

11. The method according to claim 1, wherein the step of passivating is executed for 1 to 30 minutes.

12. The method according to claim 1, wherein the step of passivating comprises the steps of:
   providing silane, nitrous oxide and methane as gradients of the SiCNO:Ar plasma; and
   providing argon as a carrier.

* * * * *